United States Patent [19]
Saitoh

[11] Patent Number: 5,826,006
[45] Date of Patent: Oct. 20, 1998

[54] METHOD AND APPARATUS FOR TESTING THE DATA OUTPUT SYSTEM OF A MEMORY SYSTEM

[75] Inventor: Toshiharu Saitoh, South Burlington, Vt.

[73] Assignee: International Business Machines Corporation, Armonk, N.Y.

[21] Appl. No.: 724,572

[22] Filed: Sep. 30, 1996

[51] Int. Cl.$^6$ ................................................ F06F 11/227
[52] U.S. Cl. ..................... 395/183.18; 371/21.2
[58] Field of Search ........................... 395/183.18, 183.2; 371/21.2, 21.1; 365/201, 200, 203

[56] References Cited

U.S. PATENT DOCUMENTS

| | | | |
|---|---|---|---|
| 4,430,712 | 2/1984 | Coulson et al. | 364/300 |
| 4,435,775 | 3/1984 | Brantingham et al. | 364/900 |
| 4,694,433 | 9/1987 | Wiedman | 365/230 |
| 4,775,942 | 10/1988 | Ferreri et al. | 364/491 |
| 4,969,148 | 11/1990 | Nadeau-Dostie et al. | 371/21.1 |
| 5,040,150 | 8/1991 | Naitoh et al. | 365/201 |
| 5,060,230 | 10/1991 | Arimoto et al. | 371/21.2 |
| 5,121,355 | 6/1992 | Gubbels et al. | 365/200 |
| 5,231,637 | 7/1993 | Tanagawa | 371/22.2 |
| 5,278,956 | 1/1994 | Thomsen et al. | 395/250 |
| 5,315,553 | 5/1994 | Morris | 365/201 |
| 5,341,382 | 8/1994 | Levitt | 371/22.1 |
| 5,343,406 | 8/1994 | Freeman et al. | 364/490 |
| 5,400,342 | 3/1995 | Matsumura et al. | 371/21.2 |
| 5,428,575 | 6/1995 | Fudeyasu | 365/201 |
| 5,436,910 | 7/1995 | Takeshima et al. | 371/21.2 |
| 5,459,733 | 10/1995 | Alapat | 371/21.1 |

Primary Examiner—Robert W. Beausoliel, Jr.
Assistant Examiner—Scott T. Baderman
Attorney, Agent, or Firm—Heslin & Rothenberg, P.C.

[57] ABSTRACT

A method and apparatus for testing or verifying proper operation of a data output system of a memory system are provided. A known data signal is applied to a bit line, independent of the memory cells of the memory system associated with the bit line. Expected outputs of the data output system are determined based upon the formation or configuration of the data output system and the known data signal. Following application of the known data signal to the bit line, actual outputs of the data output system are compared to the expected outputs to verify proper operation of the data output system.

27 Claims, 4 Drawing Sheets

METHOD AND APPARATUS FOR TESTING THE DATA OUTPUT SYSTEM OF A MEMORY SYSTEM

RELATED APPLICATION INFORMATION

This application relates to the following commonly assigned, co-pending U.S. patent applications:

Application Ser. No. 08/575,312, entitled "Field Programmable Memory Array," filed Dec. 20, 1995;

Application Ser. No. 08/575,422, entitled "System For Implementing Write, Initialization, And Reset In A Memory Array Using A Single Cell Write Port," filed Dec. 20, 1995; and Application Ser. No. 08/724,573, Attorney Docket No. FI9-96-090, entitled "Method And Apparatus For Testing The Address System Of A Memory System," filed concurrently herewith.

Each of these applications is hereby incorporated by reference herein in its entirety.

TECHNICAL FIELD

This invention relates to digital memory systems. More particularly, this invention relates to a method and apparatus for verifying proper operation of a data output system of a digital memory system.

BACKGROUND OF THE INVENTION

Test techniques for memory systems conventionally include the application of predetermined input bit patterns to memory cells of the memory system, and thereafter reading the contents of the memory cells to determine whether the output patterns match the input patterns. If the output patterns do not match the input patterns, it follows that a fault has occurred somewhere in the memory system.

Memory systems, however, are becoming increasingly complex, and the above conventional input/output pattern matching technique does not offer an adequate level of fault isolation for such complex memory systems. An exemplary, complex memory system is disclosed in the above-incorporated U.S. patent application entitled "Field Programmable Memory Array." FIG. 1 herein is a functional block diagram of the sub-systems of the field programmable memory array, which are discussed in detail in the incorporated application. Programmable memory array 10 includes a plurality of memory sub-arrays $12_1$, $12_2$, $12_3$, ... along with respective data input multiplexers $14_1$, $14_2$, $14_3$, ... and respective data output multiplexers $15_1$, $15_2$, $15_3$, ... An address system 20 produces signals on write word lines $50_1$ and read word lines $60_1$ for memory sub-array $12_1$. The signals on the write word lines are produced by using multiplexer $22_1$ and decoder $24_1$. Multiplexer $22_1$ programmably selects a write address 30 from an address bus (not shown), and decoder $24_1$ decodes the selected address and applies the proper signals to write word lines $50_1$. Multiplexer $26_1$ and decoder $28_1$ similarly process a read address 40 and apply the proper signals to read word lines $60_1$.

Data signals from the memory cells selected by the read word line signals are transmitted from the sub-arrays 12 using bit lines $16_1$, $16_2$, $16_3$, ... to a data output system 70. The data output system may include multiplexers $15_1$, $15_2$, $15_3$, ... as well as any other circuitry necessary to present to the user of the system a representation of the information stored in memory cells of the sub-arrays 12. In the field programmable memory array embodiment of a data output system, a hierarchical bit line system 18 may be employed, in addition to bit lines 16, to programmably transmit data from multiple sub-array sources to multiple output destinations.

The complexity of the memory system of FIG. 1 results from, in addition to customized memory sub-arrays 12, the data handling system including multiplexers 14 and 15, as well as the address handling system 20. The potential complexity of address system 20 can be better understood by reviewing FIGS. 26a–c of the above-incorporated U.S. patent application entitled "Field Programmable Memory Array." The potential complexity of the data output system can be better understood by reviewing FIGS. 2a–b, 18a–b, 23–25, and 29–30 of the same application.

Using the above-identified conventional input/output pattern matching test techniques for the system of FIG. 1 results in a memory system test signal path of the following form:

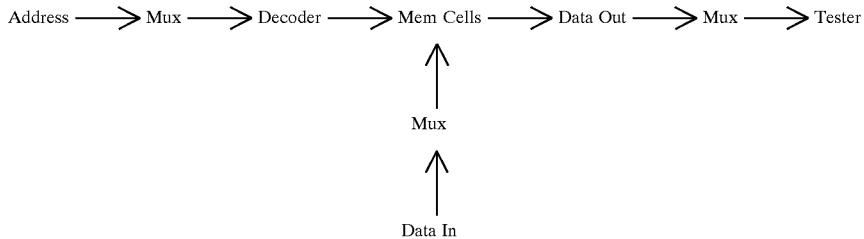

An input/output pattern matching test is adequate to indicate that a fault has occurred somewhere in the above path, however, it is not adequate to isolate a particular system within which the fault has occurred. Complex address and data handling systems are more likely to produce faults, and isolation of such faults is required to effectively test the entire system.

What is required, therefore, are test/verification methods and systems which provide a greater degree of fault isolation for complex memory systems.

SUMMARY OF THE INVENTION

The shortcomings of conventional test techniques are overcome by the present invention which provides a technique to isolate errors in the data output system of a memory system.

The memory system includes an array of memory cells, and a bit line for carrying a data signal indicative of a stored state of at least one memory cell of the array of memory cells. A data output system is coupled to the bit line for receiving the data signal therefrom. A test circuit is coupled between the bit line and a known data signal source and controls coupling of a known data signal to the bit line. A resultant data signal at an output of the data output system can be compared to an expected data signal to verify proper operation of the data output system.

The memory system may include a first coupling circuit, coupled to the bit line, for selectively coupling a first pre-charge signal component thereto during operation of the array of memory cells. The test circuit itself includes a second coupling circuit, coupled to the bit line, for selectively coupling a second signal component thereto. The first, pre-charge signal component and the second signal component comprise the known data signal and correspond to signal components expected to be carried by the bit line during operation of the memory cells.

A test enable signal source and a pre-charge control signal source are used to place the test circuit and the first coupling circuit collectively into one of two modes. In the first mode, the second coupling circuit of the test circuit is prevented from coupling the second signal component to the bit line, and the coupling of the first, pre-charge signal component to the bit line by the first coupling circuit is controlled by the pre-charge control signal source. In the second mode, the coupling of the first, pre-charge signal component by the first coupling circuit and the coupling of the second signal component by the second coupling circuit to the bit line are controlled by the test circuit as a function of the known data signal source.

In another embodiment, the present invention relates to a method for verifying proper operation of a data output system of a memory array having a plurality of memory cells arranged therein. The plurality of memory cells uses at least one bit line to transmit signals therefrom, the signals transmitted by the bit line being coupled through the data output system during operation of the memory array. The method includes, independent of the plurality of memory cells, applying a known signal to the bit line thereby resulting in an actual output signal at an output of the data output system. The actual output signal is compared to an expected output signal to verify proper operation of the data output system.

A first signal component of the known signal may be applied to the bit line using a pre-charge circuit coupled to the bit line. The pre-charge circuit is also used to pre-charge the bit line during operation of the memory array. A second signal component of the known signal may be applied to the bit line using a test circuit coupled to the bit line.

In one embodiment of the invention, the memory array comprises a programmable memory array, and the data output system thereof comprises a configurable data output system. In this embodiment, the configurable data output system is configured such that the expected output signal is expected to appear at the output of the configurable data output system.

The verification apparatus and methods of the instant invention therefore provide an effective fault-isolation technique for a data output system of a memory system. The instant invention is an improvement over conventional input/output pattern matching techniques, because the instant invention allows for isolation of a fault within the data output system, to the exclusion of any faults which may reside in other portions of the memory system.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

DETAILED DESCRIPTION OF THE PREFERRED EMBODIMENT(s)

Figure 1:
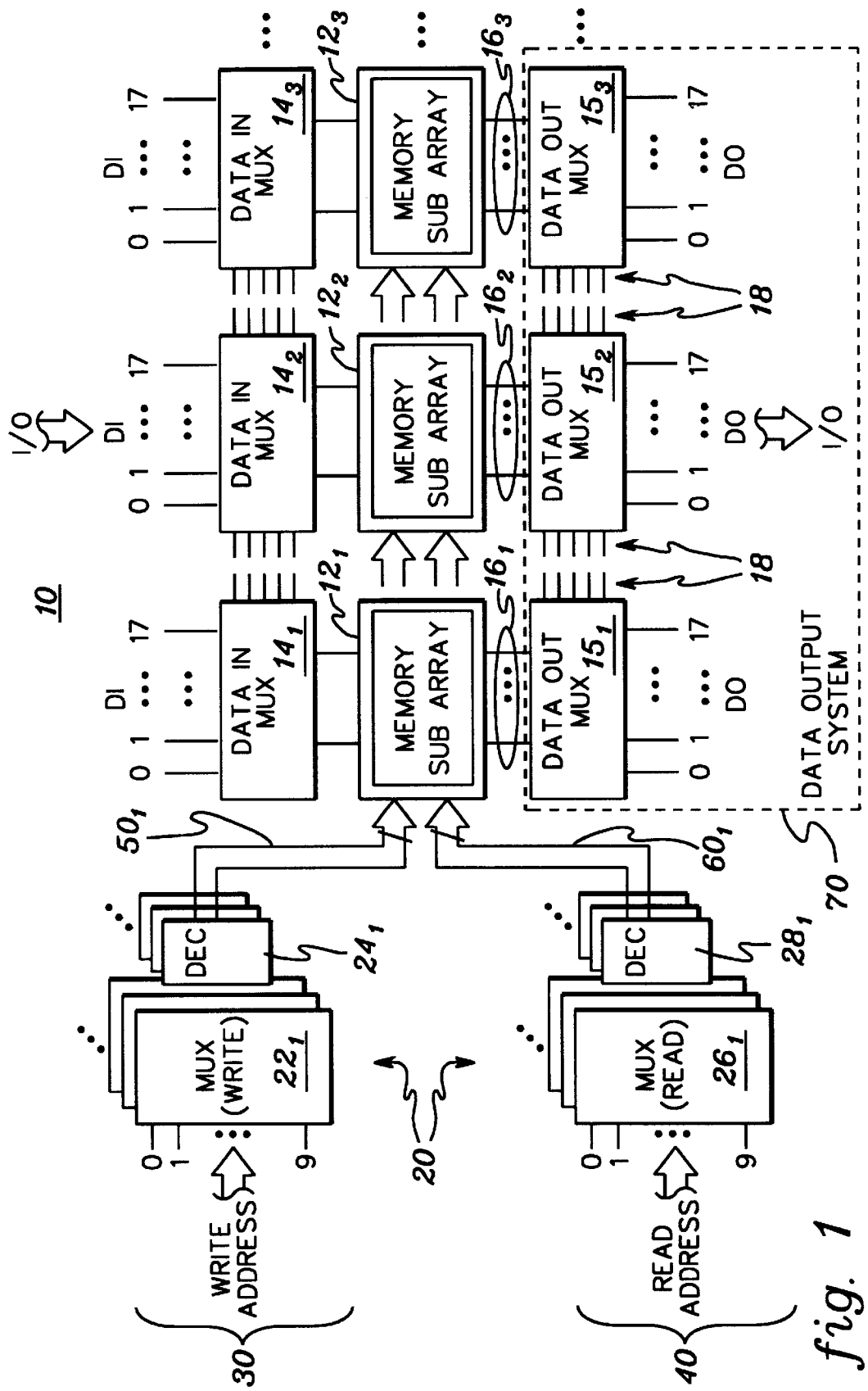
FIG. 1 is a functional block diagram of a memory system illustrating the relationship between a data output system and sub-arrays of memory cells.

As discussed above with reference to FIG. 1, a complex memory system 10 may include a complex data output system 70, including at least portions of bit lines 16, multiplexers 15, possibly a hierarchical bit line structure 18, and any necessary I/O. During normal operation of the memory system, data signals representative of the stored states of cells within sub-arrays 12 are transmitted over bit lines 16, through multiplexers 15, and are eventually presented to a user of the system. Multiplexers 15 may be programmable using configuration memory (not shown), in accordance with the above-incorporated U.S. patent application entitled "Field Programmable Memory Array." The instant invention relates to a method and apparatus for verifying the proper operation of the data output system of a complex memory system.

Figure 2:
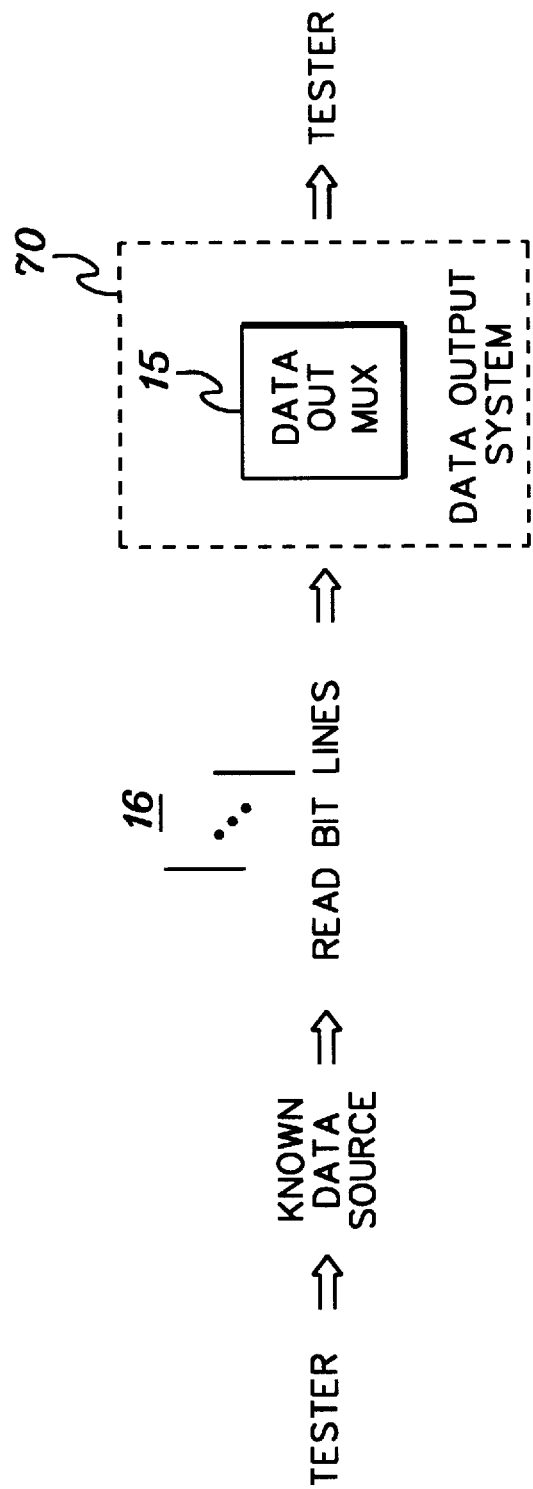
FIG. 2 is a functional block diagram depicting the signal path for testing a data output system, in accordance with the principles of the present invention.

With reference to FIG. 2, a test signal path is established, in accordance with the instant invention, over which known data signals are applied directly to bit lines 16 from an internal or external tester. Multiplexer 15, part of the data output system 70, has its inputs coupled to the bit lines (as discussed above). The outputs of the data output system are applied to the tester. A known configuration of multiplexer 15 serves as a basis upon which expected outputs thereof can be predicted, given the known data signals applied to its inputs via bit lines 16. The known configuration is determined based on the known, hard-wired formation of this portion of the data output system, or based on a configuration thereof established via configuration memory.

Once the expected outputs are determined, they can be compared by the tester to the actual outputs of the data output system. Equivalency between the expected and actual outputs results in a determination that no faults (or offsetting faults) exist in the data output system. A lack of equivalency between these outputs results in a determination that faults likely exist in the data output system.

The known data source depicted in FIG. 2 can either be driven by the actual data inputs to the sub-arrays depicted in FIG. 1 (but routed around the data input multiplexers and/or the memory cells to the output bit lines), or by an auxiliary data source or sources independent of the addressing, data input and memory cell circuitry shown generally in FIG. 1 and normally associated with a memory array.

By employing the technique depicted in FIG. 2, the test signal path is now:

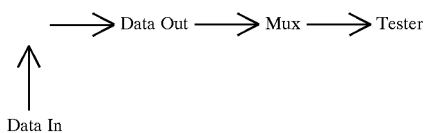

Upon comparison of this test path to the much more complicated test path illustrated above for a conventional input/output pattern matching test, it is evident that a fault can now be isolated within the data output system itself without regard to the operation of the memory sub-arrays or their data input or addressing systems. Such fault isolation is especially necessary when considering the rather complex data output systems being employed in memory systems, such as a field programmable memory array. As discussed above, such data output systems may contain configurable multiplexers and a hierarchical bit line routing system.

The verification technique of the instant invention can isolate faults to the data output system which may include the multiplexer 15 depicted in FIG. 2, as well as the configuration memory (not shown) which may be associated with multiplexer 15, any follow-on input/output facilities, the bit lines themselves, and the hierarchial bit line routing system (if employed).

Figure 3A:
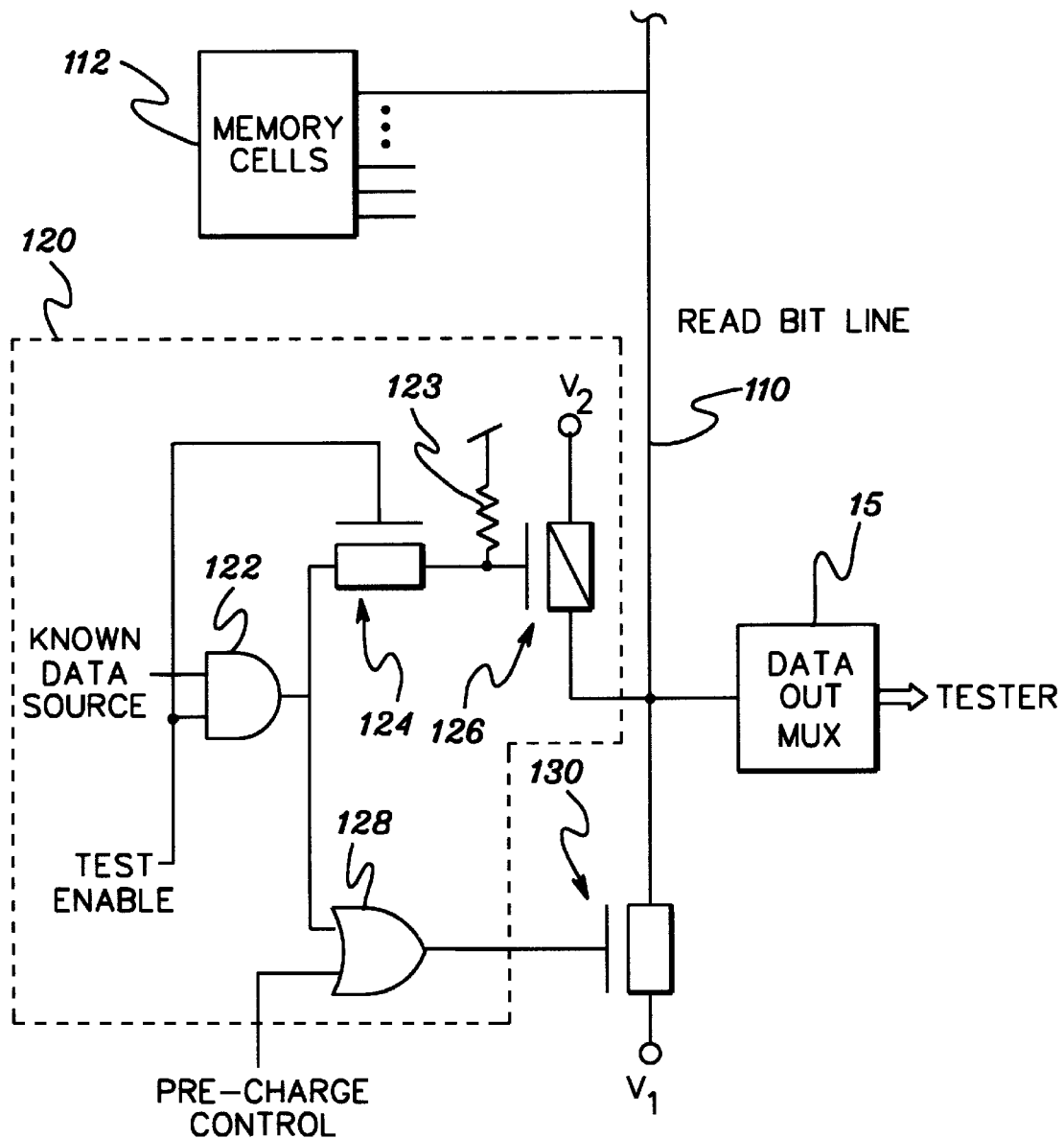
FIGS. 3a–b are schematics of two exemplary embodiments of a test circuit, in accordance with the principles of the present invention.
Figure 3B:
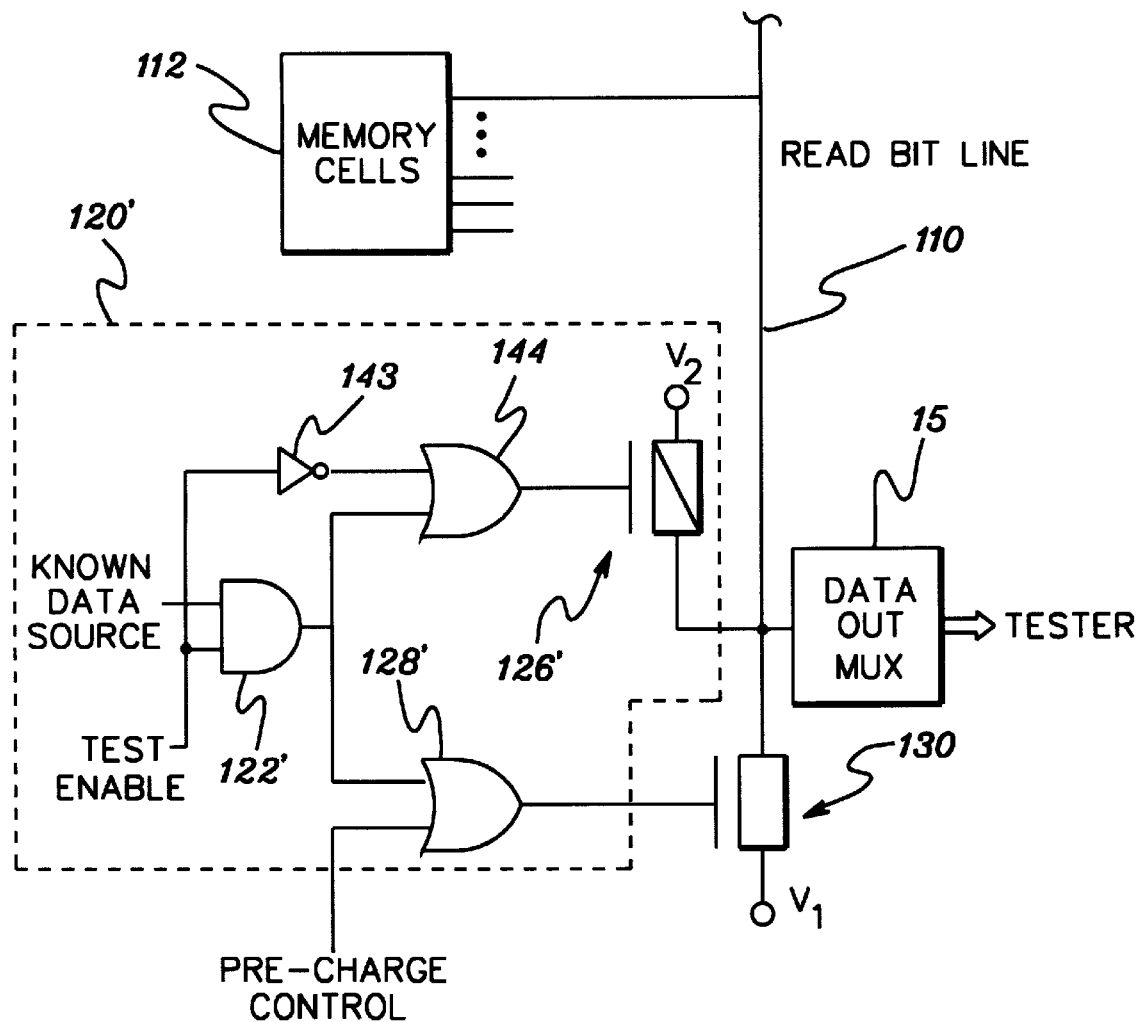

Two exemplary embodiments of a test circuit for applying known data to a bit line are depicted in schematic form in FIGS. 3a–b. With reference to FIG. 3a, memory cells 112 are associated with bit line 110. Those skilled in the art will recognize that numerous configurations are possible connecting memory cells 112 to their associated bit line 110. As discussed above, bit line 110 carries data indicative of the stored state of memory cells 112 and that data is propagated through data output multiplexer 15, the outputs of which are applied to a tester.

Also depicted in FIG. 3a is a pre-charge coupling circuit 130 for coupling a voltage level $V_1$ to bit line 110, during operation of memory cells 112. Pre-charge coupling circuit 130 may be an N-FET transistor as shown, the control gate of which is usually driven by a pre-charge control line. Those skilled in the art will recognize that such pre-charge coupling circuits are used in many memory circuits to charge the bit line which usually has a parasitic capacitance. Using a pre-charge approach, the memory cells 112 need only maintain or discharge the charge on bit line 110, and therefore need not be of sufficient size to drive the parasitic capacitance on bit line 110 from one signal level to another signal level. Therefore, the existence of pre-charge coupling circuit 130 allows memory cells 112 to have less drive capability and therefore be smaller in size. The smaller size of these memory cells results in a greater density and thus a greater overall size of the memory array per unit area.

In accordance with this embodiment of the invention, a test circuit 120 is employed in combination with pre-charge coupling circuit 130 to drive bit line 110 with a known data signal. The known data signal usually includes two components, in this embodiment voltage levels, which are the levels expected to be carried by bit line 110 during operation of memory cells 112. Test circuit 120 employs an additional coupling circuit 126, which couples the second voltage level $V_2$ to the bit line, and further includes the necessary circuitry to enable test circuit control of both coupling circuits 126 and 130 during test, while also allowing disabling of coupling circuit 126 and control of coupling circuit 130 via the pre-charge control line during normal memory array operation. These two modes of the circuitry are made possible by AND gate 122, transistor 124, and OR gate 128.

First Mode—Array Operation

As discussed above, a known data signal is applied to the bit line 110 in accordance with a known data source, depicted as one of the inputs to AND gate 122. Another input of AND gate 122 is the test enable line. The test enable line is also applied to the control gate of N-FET transistor 124, and the controllable current path through transistor 124 is connected between the output of AND gate 122 and the control gate of P-FET transistor 126. If test enable is low, triggering of AND gate 122 is inhibited and the control gate of transistor 126 is held high via pull-up resistor 123. In this configuration, coupling circuit 126 is disabled and therefore is prevented from applying level $V_2$ to bit line 110. Further, with test enable low, AND gate 122 is not triggered, and therefore the output of OR gate 128 is controlled by the pre-charge control line. Therefore, coupling circuit 130 is controlled solely by the usual pre-charge control line during normal operation of the memory array. The path from the test enable line to and including the control gate of transistor 124, and its effect on coupling circuit 126, is an exemplary embodiment of what is generally referred to herein as the test enable path. The path from the pre-charge control line to the coupling circuit 130, including OR gate 128, is an exemplary embodiment of what is generally referred to herein as the pre-charge control path. Those skilled in the art will recognize that various forms of circuitry can be employed to provide the inventive functionality of the test enable and pre-charge control paths without departing from the principles of the present invention.

Second Mode—System Test

In the second mode of operation, test circuit 120 is enabled by a high signal level on the test enable line. A high signal on the test enable line allows the output of AND gate 122 to be controlled solely by the known data source. Further, a high signal level on the test enable line turns on the current path through transistor 124, and therefore allows the output level of AND gate 122 to directly drive the control gate of coupling circuit 126. (Those skilled in the art will recognize that the value of resistance 123 is generally large, but the value at the control gate of coupling circuit 126 can be effectively pulled low by a stronger AND gate 122 output.) During the second mode, pre-charge control line is held low, so that OR gate 128 is controlled solely by the output of AND gate 122. The value at the output of AND gate 122 is thus propagated through OR gate 128 to the control gate of coupling circuit 130. Alternating levels of the known data source will thus result in alternating levels applied to the orthogonally formed (P-FET/N-FET) pair of transistor coupling circuits 126 and 130, thus resulting in a corresponding set of alternating levels applied to bit line 110. Voltage levels $V_1$ and $V_2$ are appropriately chosen to correspond to the expected signal levels on bit line 110 during operation of memory cells 112. During the second, test mode, the voltage levels present on bit line 110 are applied to the bit line and therefore to the data output multiplexer 15 of the data output system. As discussed above, the outputs of the data output system can be compared to the expected outputs thereof, considering the known data source, and an indication of any faults in the data output system can be obtained by this comparison.

The paths from the known data source to and including the coupling circuits 126 and 130 are exemplary embodiments of what are referred to herein as data paths. Those skilled in the art will recognize that various forms of circuitry can be employed to provide the inventive functionality of those data paths without departing from the principles of the present invention.

FIG. 3b is an alternate embodiment 120' of test circuit 120 of FIG. 3a. Elements 122', 126', and 128' correspond to elements 122, 126, and 128 of FIG. 3b. However, elements 123 and 124 of FIG. 3a are replaced in FIG. 3b by invertor 143 and OR gate 144. Those skilled in the art will recognize that this arrangement of circuits results in the same type of orthogonal control of coupling circuits 126' and 130 for the corresponding application of levels $V_1$ and $V_2$ to bit line 110.

Tables 1 and 2 below are truth tables of the relevant states of the devices depicted in FIGS. 3a, and 3b, respectively during the second, test mode of operation.

TABLE 1

Truth Table - FIG. 3a

| PRE-CHARGE CONTROL | TEST ENABLE | KNOWN DATA | 122 | 124 (N) | 126 INPUT | 126 (P) | 128 | 130 (N) | BL |
|---|---|---|---|---|---|---|---|---|---|
| 0 | 0 | 0 | 0 | OFF | 1 | OFF | 0 | OFF | — |
| 0 | 0 | 1 | 0 | OFF | 1 | OFF | 0 | OFF | — |
| 0 | 1 | 0 | 0 | OFF | 0 | ON | 0 | OFF | $V_2$ |
| 0 | 1 | 1 | 1 | OFF | 1 | OFF | 1 | ON | $V_1$ |

TABLE 2

Truth Table - FIG. 3b

| PRE-CHARGE CONTROL | TEST ENABLE | KNOWN DATA | 122' | 143 | 144 | 126' (P) | 128' | 130 (N) | BL |
|---|---|---|---|---|---|---|---|---|---|
| 0 | 0 | 0 | 0 | 1 | 1 | OFF | 0 | OFF | — |
| 0 | 0 | 1 | 0 | 1 | 1 | OFF | 0 | OFF | — |
| 0 | 1 | 0 | 0 | 0 | 0 | ON | 0 | OFF | $V_2$ |
| 0 | 1 | 1 | 1 | 0 | 1 | OFF | 1 | ON | $V_1$ |

Those skilled in the art will recognize that the signal polarities and types of gates employed in the test circuit may be varied without departing from the principles of the present invention. The term "gate" is used broadly herein to denote any type of electrical circuit. The terms "coupling" and "connecting" are used broadly herein to denote direct connections between elements, or indirect connections (e.g., buffered/inverted) over which the associated information is nevertheless communicated between elements.

In the exemplary embodiments of FIGS. 3a–3b, an existing pre-charge circuit is employed with the added test circuit to apply one of the signal levels required. This unique use of the existing pre-charge circuit allows the remainder the test circuit itself to occupy less additional circuit area than would otherwise be possible. However, this invention also contemplates the application of known signals to bit lines, independent of the memory cells, and without the use of existing pre-charge circuits.

If a hierarchical bit line output structure is employed, the circuits of FIGS. 3a–b could also be employed to apply known data signals to any of the bit lines thereof, to test downstream portions of the data output system.

This invention may also be used in combination with the address system test techniques disclosed in the above-incorporated U.S. patent application entitled "Method and Apparatus For Testing The Address System Of A Memory System" to provide fault isolation to the address and/or data output systems.

The instant invention offers a greater degree of fault isolation in memory systems than conventional input/output pattern matching tests can provide. This greater degree of fault isolation is especially important for complex memory systems, in which the complexity of the individual systems therein increases the likelihood of untraceable errors when using a conventional input/output pattern matching technique.

While the invention has been particularly shown and described with reference to preferred embodiment(s) thereof, it will be understood by those skilled in the art that various changes in form and details may be made therein without departing from the spirit and scope of the invention.

What is claimed is:

1. A method for verifying proper operation of a data output system of a memory array having a plurality of memory cells arranged therein, the plurality of memory cells using at least one bit line to transmit signals therefrom, the signals transmitted by the at least one bit line being coupled through the data output system during operation of the memory array, the method comprising:

applying, independent of the plurality of memory cells using the at least one bit line, a known signal to the at least one bit line thereby resulting in an actual output signal at an output of the data output system, wherein the known signal includes a first stable component and a second stable component; and comparing the actual output signal to an expected output signal to verify proper operation of the data output system.

2. The method of claim 1, wherein said applying a known signal includes;

applying the first stable component of the known signal to the at least one bit line using a pre-charge circuit coupled to the at least one bit line, the pre-charge circuit being used to pre-charge the at least one bit line during operation of the memory array.

3. The method of claim 2, wherein said applying a known signal further includes:

applying the second stable component of the known signal to the at least one bit line using a test circuit coupled to the at least one bit line.

4. The method of claim 1, wherein the memory array comprises a programmable memory array and the data output system thereof comprises a configurable data output system, and wherein said method includes:

configuring the configurable data output system such that the expected output signal is expected to appear at the output of the configurable data output system.

5. A system for verifying proper operation of a data output system of a memory array having a plurality of memory cells arranged therein, the plurality of memory cells using at least one bit line to transmit signals therefrom, the signals transmitted by the at least one bit line being propagated through the data output system during operation of the memory array, the system comprising:

means for applying, independent of the plurality of memory cells using the at least one bit line, a known signal to the at least one bit line thereby resulting in an actual output signal at an output of the data output system, wherein the known signal includes a first stable component and a second stable component; and means for comparing the actual output signal to an expected output signal to verify proper operation of the data output system.

6. The system of claim 5, wherein said means for applying a known signal includes:

means for applying the first stable component of the known signal to the at least one bit line, including a pre-charge circuit coupled to the at least one bit line, the pre-charge circuit being used to pre-charge the at least one bit line during operation of the memory array.

7. The system of claim 6, wherein said means for applying a known signal further includes:

means for applying the second stable component of the known signal to the at least one bit line, including a test circuit coupled to the at least one bit line.

8. The system of claim 5, wherein the memory array comprises a programmable memory array and the data output system thereof comprises a configurable data output system, the system further including:

means for configuring the configurable data output system such that the expected output signal is expected to appear at the output of the configurable data output system.

9. A memory system, comprising:

an array of memory cells;

a bit line for carrying a data signal indicative of a stored state of at least one memory cell of the array of memory cells;

a data output system, coupled to the bit line, for receiving the data signal therefrom;

a rest circuit, coupled between the bit line and a known data signal source, the test circuit controlling coupling of a known data signal to the bit line such that a resultant data signal at an output of the data output system can be compared to an expected data signal to verify proper operation of the data output system independent of the array of memory cells, wherein the known data signal includes a first, stable pre-charge signal component and a second, stable signal component.

10. The memory system of claim 9, further comprising:

a first coupling circuit, coupled to the bit line, for selectively coupling the first, stable pre-charge signal component thereto during operation of the array of memory cells.

11. The memory system of claim 10, wherein the test circuit includes:

a second coupling circuit, coupled to the bit line, for selectively coupling the second signal component thereto.

12. The memory system of claim 11, wherein the first, stable pre-charge signal component and the second, stable signal component comprise the known data signal and correspond to signal components expected to be carried by the bit line during operation of the array of memory cells.

13. The memory system of claim 12, further comprising:

a test enable signal source for enabling said test circuit.

14. The memory system of claim 13, further comprising a pre-charge control signal source for controlling the first coup ling circuit.

15. The memory system of claim 14, wherein the test enable signal source and the pre-charge control signal source are used to place said test circuit and said first coupling circuit collectively into one of two modes comprising:

a first mode wherein said second coupling circuit is prevented from coupling the second, stable signal component to the bit line, and the coupling of the first, stable pre-charge signal component to the bit line by the first coupling circuit is controlled by the pre-charge control signal source; and a second mode wherein the coupling of the first, stable pre-charge signal component by the first coupling circuit and the coupling of the second, stable signal component by the second coupling circuit to the hit line are controlled by the test circuit as a function of the known data signal source.

16. The memory system of claim 9, further comprising:

a first coupling circuit for selectively coupling the first, stable pre-charge signal component to the bit line during operation of the array of memory cells; and wherein said test circuit controls the coupling of said first, stable pre-charge signal component to the bit line by said first coupling circuit during testing of the memory system.

17. The memory system of claim 16, wherein said test circuit includes:

a second coupling circuit for coupling the second, stable signal component to the bit line; and wherein the first, stable pre-charge signal component and the second, stable signal component comprise the known data signal, the application of which to the bit line is controlled by the test circuit during testing of the memory system.

18. The memory system of claim 9, further comprising:

a first coupling circuit, coupled to the bit line, for selectively coupling thereto the first, stable pre-charge signal component in the form of a first voltage level; and wherein the test circuit includes:

a second coupling circuit, coupled to the bit line, for selectively coupling thereto the second, stable signal component in the form of a second voltage level, the first and second voltage levels comprising the known data signal; and first and second data paths, respectively coupled between the first and second coupling circuits and the known data signal source, for controlling the coupling of said first and second voltage levels to said bit line.

19. The memory system of claim 18, further comprising:

a first control path for controlling the coupling of the first voltage level to the bit line by said first coupling circuit; and wherein the test circuit further comprises:

a test circuit enable path for enabling and disabling a response of the second coupling circuit to said second data path.

20. The memory system of claim 19, wherein:

the first coupling circuit comprises a transistor have a control gate, and a controllable path connected between the first voltage level and the bit line; and the second coupling circuit comprises a transistor having a control gate, and a controllable path connected between the second voltage level and the bit line.

21. The memory system of claim 20, wherein the test circuit further includes:

an AND gate having a first input coupled to the known data signal source and a second input coupled to a test enable signal source;

a first OR gate having a first input coupled to the output of said AND gate, a second input coupled to a first control node, and an output coupled to the control gate of the first coupling circuit; and wherein the first OR gate and the first control node comprise the first control path, and the first OR gate and the AND gate comprise the first data path.

22. The memory system of claim 21, wherein the test circuit further includes:

an enable transistor having a control gate, and a controllable path coupled between the output of said AND gate and the control gate of said second coupling circuit, the control gate of the enable transistor being controlled by the test enable signal source; and wherein the control gate of the enable transistor and the test enable signal source comprise the test circuit enable path, and the controllable path of the enable transistor and the AND gate comprise the second data path.

23. The memory system of claim 21, wherein the test circuit further includes:

a second OR gate having a first input coupled to the output of said AND gate, a second input controlled by the test enable signal source, and an output coupled to the control gate of said second coupling circuit; and wherein the second OR gate and the test enable signal source comprise the test circuit enable path, and the second OR gate and the AND gate comprise the second data path.

24. The memory system of claim 23, wherein said first coupling circuit comprises a pre-charge circuit used during operation of the at least one memory cell to pre-charge the bit line, the first voltage level comprises a pre-charge voltage level, and the first control path comprises a pre-charge control path.

25. The memory system of claim 18, wherein said first coupling circuit comprises a pre-charge circuit used during operation of the at least one memory cell to pre-charge the bit line, and the first voltage level comprises a pre-charge voltage level.

26. A field programmable memory array having the memory system of claim 9 therein, the data output system thereof comprising configurable circuitry and configuration memory associated therewith.

27. The field programmable memory array of claim 26, wherein the configurable circuitry includes at least one configurable multiplexer.

\* \* \* \* \*

UNITED STATES PATENT AND TRADEMARK OFFICE
CERTIFICATE OF CORRECTION

PATENT NO. : 5,826,006
DATED : October 20, 1998
INVENTOR(S) : Toshiharu Saitoh

It is certified that error appears in the above-identified patent and that said Letters Patent is hereby corrected as shown below:

Col. 7, TABLE 1, under the heading "124 (N)", delete the third and fourth instances of "OFF" and replace with --ON--.

In the Claims:

Claim 9, Col. 9, line 53, delete "rest" and replace with --test--.

Claim 14, Col. 10, line 15, delete "coup ling" and replace with --coupling--.

Claim 15, Col. 10, line 29, delete "hit" and replace with --bit--.

Signed and Sealed this

Twenty-fifth Day of May, 1999

Attest:

Q. TODD DICKINSON

*Attesting Officer*    *Acting Commissioner of Patents and Trademarks*